United States Patent [19]

Laupman

[11] 4,099,135

[45] Jul. 4, 1978

[54] ELECTRONIC ECHO DEVICE

[75] Inventor: Robert Ronald Laupman, Wijchen, Netherlands

[73] Assignee: Novanex Automation N.V., Wijchen, Netherlands

[21] Appl. No.: 725,145

[22] Filed: Sep. 20, 1976

[30] Foreign Application Priority Data

Sep. 18, 1975 [NL] Netherlands ........................ 7510999

[51] Int. Cl.[2] .............................................. H03F 1/36

[52] U.S. Cl. .................................... 330/109; 84/1.24; 330/107

[58] Field of Search ................ 84/1.01, 1.24; 330/107, 330/109; 179/1 J

[56] References Cited

U.S. PATENT DOCUMENTS 3,838,202 9/1974 Nakada ................................ 84/1.01

*Primary Examiner*—Lawrence J. Dahl

[57] ABSTRACT

An electronic echo device comprising an input amplifier, an output amplifier connected therewith across a transfer channel, a delay device connected in parallel to said channel, and a feedback path connected in parallel to said delay device. According to this invention a control device is included between the input of the echo device and the delay device, to which control device the feedback path is also connected. The arrangement is such that the gain factor of the control device, upon a relatively sudden change in the signal level supplied to it, varies to counter-act said change.

2 Claims, 5 Drawing Figures

ELECTRONIC ECHO DEVICE

Figure 1:
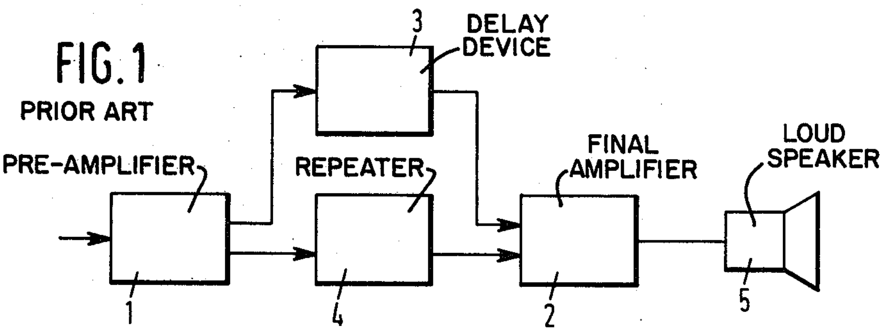
FIG. 1 PRIOR ART

An electronic echo device is known to comprise a delay device which is connected in parallel to at least a part of an amplifier channel. Preferably there is applied a pre-amplifier including a tone control device, the input signal for the echo device being tapped from said pre-amplifier and the output signal of the echo device being so mixed again with the signal derived from the pre-amplifier that the output signal from the echo device cannot reach the pre-amplifier. The mixed signal is then applied to a final amplifier.

In such a device the echo device may comprise a delay line on the basis of a tape recording and reproducing device, a helical delay line or an analogue electronic delay line having a bucket memory or a digital system.

In such an echo device the input signal is supplied to a pre-amplifier which may be combined with a filter, whereafter the signal is supplied to the delay device, e.g. a delay line and, if necessary, is amplified again by an output amplifier to the desired level, then being available as an output signal.

In such a device the output signal can again be partly added to the input signal, in which case the repetitive effect can be extended by circulating the signal a number of times in the device with decreasing strength so that an echo-resound effect is produced. When the feedback is controllable the echo effect can be varied from a single repetition to an almost infinitely long resound.

In such a case, however, a number of problems and requirements present themselves:

In the first place, in the case of an excessive number of repetitions, the device becomes instable and starts to "beat". Consequently there is a need for a stabilizing device which stabilizes the signal during a high degree of feedback. In the second place, in particular when the number of repetitions in the practice of the echo production for song and instrument amplification becomes greater, the repetition effect becomes irritable if this continues to take place a number of times faithfully. This means that when in case of a vocal reproduction the repetition is always performed one of a few times, this results in a practicable filling being obtained after the reproduced song. However, when there is a need for longer resound, this can no longer be realized by increasing the number of repetitions since then the repeated faithful reproduction leads to an irritating "parrot" effect.

Consequently it is clear that in those cases there is a need for a suppression of this effect.

According to the present invention this can be obtained to a high degree by employing a so-called "floating" compression-expansion device. This device has the purpose of equalizing sudden variations in the signal level, i.e., both reducing a sudden increase and reducing a sudden decrease. The former may be effected by reducing the gain factor of the amplifying channel, the latter by increasing the gain factor thereof.

When such an automatically controlling amplifier is applied such that it functions as mixing amplifier for the input and feedback signal, the following effect is obtained.

When a word is sung the consonants which in the first place are sudden variations in the signal strength, are strongly suppressed, while vowels are substantially passed as tone carriers. When after a certain time, the delay time, the signal re-appears as a mixed signal, as a result of the use of the automatically controlling amplifier according to the invention, the sudden rise of the mixed signal will be dimmed so that the reproduced tone may swell more smoothly. When the supplied signal suddenly stops, the gain factor of the control amplifier will be strongly increased so that this transition, too, will be strongly dimmed.

The result obtained according to the present invention consequently is a strongly reduced parrot effect.

The same applies to the addition of resound effects to signals originating from musical instruments, since in this case similar effects occur with the input signal of the echo device. Thus, for example, the touch of a guitar can be compared with a consonant in singing. Also an organ has a clear beginning when a key is depressed. The control amplifier according to the invention may moreover be so dimensioned as to simultaneously provide an over-excitation limitation for the delay time.

As may appear from the above it is an object of the present invention to provide an echo device that upon a single repetition produces an echo effect that is close to that of a conventional echo device, while upon increase of the feedback the resulting effect becomes increasingly longer, resembling more and more a resound effect.

Figure 2:
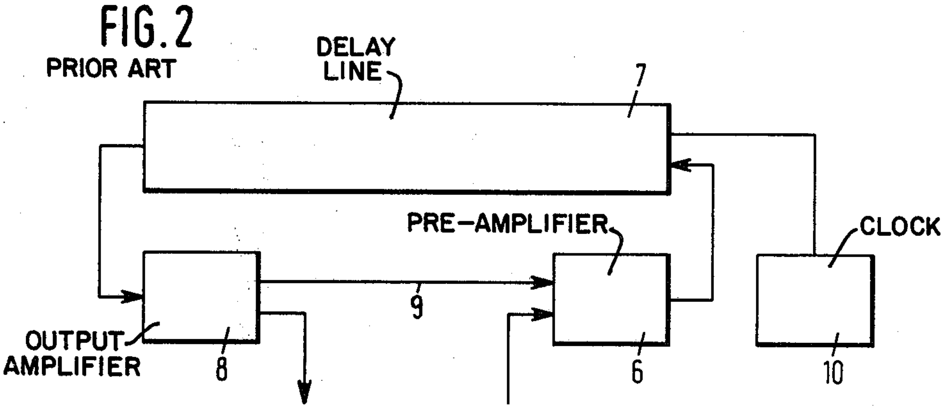
FIG. 2 PRIOR ART
Figure 3:
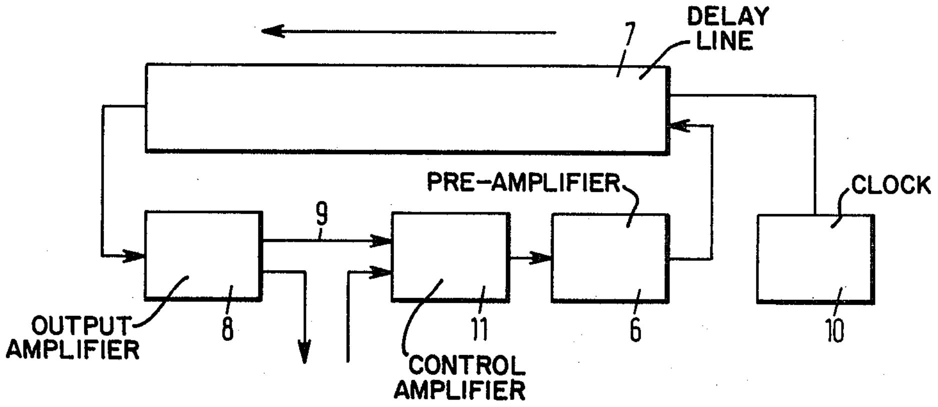
Figure 4:
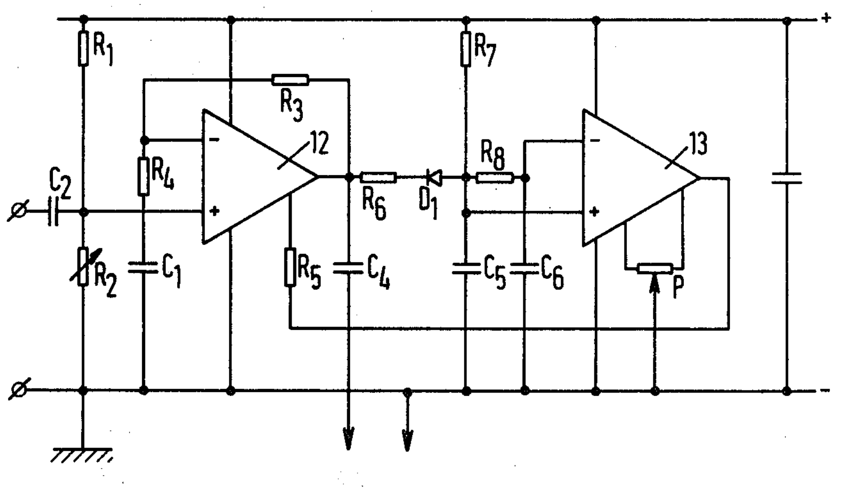
Figure 5:
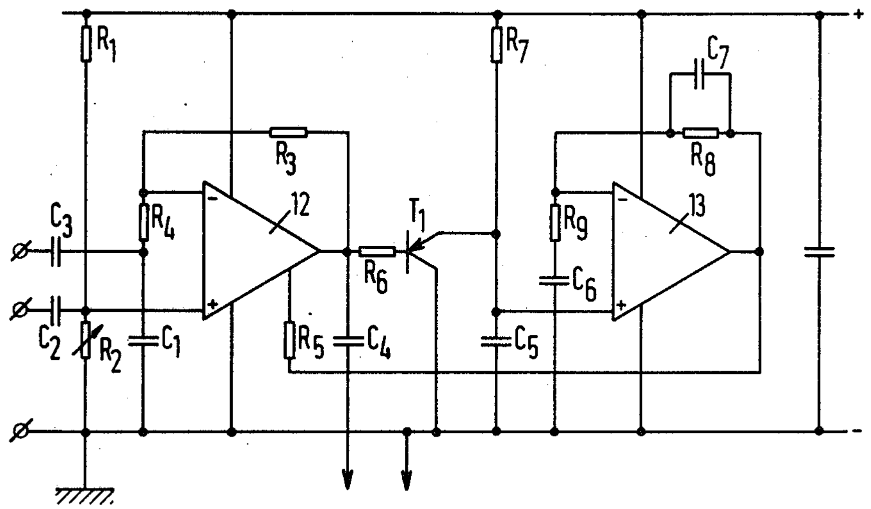

Some embodiments of the present invention will now be described, by way of example, with reference to the accompanying drawings, wherein:

FIG. 1 shows an electronic echo device of a conventional type;

FIG. 2 an echo device wherein use is made of a feedback for obtaining multiple echo and resound effects;

FIG. 3 a device similar to that shown in FIG. 2, but provided with a control device according to the present invention;

FIG. 4 a diagram of one embodiment of a control amplifier according to the invention; and FIG. 5 a modified embodiment of a control amplifier according to the invention.

As shown in FIG. 1 of the drawings an electronic echo device of a conventional type comprises a pre-amplifier 1 to which can be supplied an input signal and which pre-amplifier may be connected through a repeater 4 to a final amplifier 2. The output of the pre-amplifier 1 is also connected across a delay device 3 to the input of the final amplifier 2. The output of the final amplifier 2 is connected to a reproducing device 5 which is depicted here as a loudspeaker. Accordingly, in this device the input signal supplied to pre-amplifier 1, after passing repeater 4, if any, is mixed at the input of final amplifier 2 with the delayed signal from delay device 3, the repeater likewise serving to prevent a feedback of the signal from delay device 3 to pre-amplifier 1. The mixed signal is supplied from the final amplifier to reproducing device 5.

As shown in FIG. 2 the delay device may be provided with a delay line 7 to which the input signal is supplied via a pre-amplifier 6 which may be provided with a filter. From delay line 7, there is then derived an output signal which, via output amplifier 8, is supplied to the output of the device. As shown, a clock serving for delay line 7 is provided at 10. Furthermore, between the output of final amplifier 8 and the input of pre-amplifier 6 there is provided a feedback path 9. Across said feedback path 9 a part of the output signal of output amplifier 8 can be re-supplied to input amplifier 6 for it to be re-transmitted across the delay line 7, so that there is obtained a repetitive effect. As stated above it is possible in such a device to obtain an echo-resound effect by causing the signal to circulate a number of times with decreasing strength. Although not shown in FIG. 2, it will be clear that the feedback path may somehow be made controllable in order to vary the echo effect from a single repetition to an almost infinitely long resound.

In order to eliminate in such a device the above indicated difficulties and to fill specific needs, the device depicted in FIG. 2 is modified according to the present invention in a manner shown in FIG. 3, in which figure the same reference numerals are used for the parts that correspond to those of FIG. 2. It appears from FIG. 3 that in this construction the input signal is not supplied direct to the pre-amplifier but across a control amplifier 11, whereby the signal from final amplifier 8 is partly transmitted across feedback path 9 to said control amplifier.

According to the present invention the gain factor of said control amplifier is variable so that upon a relatively rapid change of the signal supplied thereto said change is counter-acted in such a way that an equalization is obtained, as explained in the above.

FIG. 4 shows a diagram of one embodiment of the control amplifier 11 shown in FIG. 3.

In the circuitry shown in FIG. 4, the input signal is supplied via a capacitor $C_2$ and the setting voltage dividers $R_1$, $R_2$ to the plus-input of an amplifier 12 which may be an operational transconductance amplifier. The output of said amplifier 12 is fed back through a resistor $R_3$ to the minus-input of the amplifier which, however, is strongly decoupled by means of a relatively small resistor $R_4$ and a capacitor $C_2$. The output signal of amplifier 12 is delivered via capacitor $C_4$.

The output of amplifier 12 is furthermore connected through a resistor $R_6$ and a diode $D_1$ to a capacitor $C_5$ which therefore, apart from losses and the voltage across diode $D_1$, adjusts to the output voltage of amplifier 12. A resistor $R_7$ ensures that the capacitor $C_5$ scans the signal peaks of the output signal of amplifier 12.

Connected in parallel with capacitor $C_5$, through a resistor $R_8$, is a capacitor $C_6$ having a larger capacity than capacity than capacitor $C_5$, which means that the voltage across capacitor $C_6$ lags behind the voltage variation across capacitor $C_5$, but after a specific period of time will again attain the same value as that across capacitor $C_5$ with a constant given voltage of capacitor $C_5$. Capacitor $C_5$ is connected to the plus-input of an amplifier 13 which may comprise a normal operational amplifier. To the minus-input of said amplifier is connected the capacitor $C_6$. The output of amplifier 13 is connected through resistor $R_5$ to the control input of amplifier 12.

The above described circuitry operates as follows:

When amplifier 12 transmits a constant signal or no signal, the voltages across capacitors $C_5$ and $C_6$ are substantially equal and a voltage having constant value appears at the output of amplifier 13, which voltage can be set by means of a potentiometer P. Amplifier 12 has a corresponding required gain factor.

When the input signal of amplifier 12 suddenly increases, the voltage across capacitor $C_5$ will decrease relative to that of capacitor $C_6$ and the output voltage of amplifier 13 will strongly decrease so that the gain factor of amplifier 12 will strongly decrease, too.

When, on the other hand, the input signal of amplifier 12 suddenly decreases, the voltage across capacitor $C_5$ strongly increases relative to that of capacitor $C_6$, so that the output signal of amplifier 13 strongly increases the gain factor of amplifier 12.

Both effects, however, are of a temporary nature since after some time the voltage across capacitor $C_6$ has again attained the value of the voltage across capacitor $C_5$.

As a result the gain factor of amplifier 12 eventually always substantially returns to the output level thereof. The result is a strongly equalizing influence on the magnitude of the signal concerned.

A drawback of the circuitry as shown in FIG. 4 is that it is necessary both to set amplifier 12 by means of a controllable resistor $R_2$ at the desired average output voltage and to set amplifier 13 by means of potentiometer P.

FIG. 5 shows a different embodiment according to the present invention, the operation of which corresponds to that described above with reference to FIG. 4, but wherein use is made of the known automatic setting of an operational amplifier. In FIG. 5 the same reference numerals are used to designate parts similar to those shown in FIG. 4. Hence, only the differences between the two embodiments will be described in more detail in the following.

In the embodiment shown in FIG. 5, the mixed signal is supplied to the bottom side, as seen in the drawing, of resistor $R_4$ via capacitor $C_3$. Diode $D_1$ of FIG. 4 is replaced in FIG. 5 by a transistor $T_1$ by means of which the reaction speeds in the two control devices can be selected to suit requirements by means of resistors $R_6$ and $R_7$. By means of a resistor $R_9$ the gain factor of amplifier 13 and hence the "steepness" of the control system is determined. Accordingly, this can be set with resistor $R_9$ for obtaining an optimal attenuation effect.

Furthermore, there is connected in parallel to resistor $R_8$ a capacitor $C_7$ to attenuate the basic frequency at the output of amplifier 12 across amplifier 13 in a more effective manner.

It should be understood that the present invention is not limited to a specific type of delay line but that any known delay line, such as a bucket memory delay line, can be employed for this purpose.

I claim

1. An electronic signal processing device comprising: an input and an output terminal, a final amplifier, a delay device having an input and being connected through said final amplifier to said output terminal of said processing device, a feed-back loop, and a control device for providing an echo effect, said control device being connected between said input of said processing device and said input of said delay device, the output of said final amplifier being connected to the input of said control device through said feed-back loop, said control device having means for varying the gain factor of said control device such that upon a sudden change in the input signal level applied thereto the gain factor is changed accordingly to counteract said change.

2. A device according to claim 1, wherein said control device comprises a first amplifier having an input and output, a first capacitor coupled to the output of said first amplifier, a resistor, a second capacitor having a larger capacitance than said first said capacitor and being connected in parallel to said first capacitor via said resistor, a second amplifier having a first input terminal and a second input terminal, said first capacitor being connected to said first input terminal and said second capacitor being connected to said second input terminal, said second amplifier having an output coupled to the central input of said first amplifier.

* * * * *

UNITED STATES PATENT AND TRADEMARK OFFICE

CERTIFICATE OF CORRECTION

PATENT NO. : 4,099,135

DATED : July 4, 1978

INVENTOR(S) : ROBERT RONALD LAUPMAN

It is certified that error appears in the above-identified patent and that said Letters Patent are hereby corrected as shown below:

Column 4, line 67, change "central" to -- control --.

Signed and Sealed this

*Sixteenth* Day of *January 1979*

[SEAL]

*Attest:*

RUTH C. MASON
*Attesting Officer*

DONALD W. BANNER
*Commissioner of Patents and Trademarks*